PULSE TRIGGERED OSCILLATION GENERATORS WITH MINIMAL TRANSIENT BUILD-UP

Filed Feb. 2, 1966

INVENTOR
Eric Davies
BY Baldwin & Wight
ATTORNEY

United States Patent Office 3,363,198
Patented Jan. 9, 1968

3,363,198

PULSE TRIGGERED OSCILLATION GENERATORS WITH MINIMAL TRANSIENT BUILD-UP

Eric Davies, Danbury, Essex, England, assignor to The Marconi Company Limited, London, England, a British company Filed Feb. 2, 1966, Ser. No. 524,568
Claims priority, application Great Britain, Feb. 18, 1965, 7,086/65
10 Claims. (Cl. 331—117)

ABSTRACT OF THE DISCLOSURE

A pulse triggered oscillator includes a transistor having a tuned tank circuit consisting of a capacitor and an inductor in its collector circuit. A feed-back path containing a further capacitor interconnects a tap on the inductor and the transistor emitter. Trigger pulses to switch the transistor on and off are applied to the base. The feedback capacitor charges through a resistor in the emitter circuit, when the transistor is in off condition, and discharges into the tank circuit when the transistor is in on condition. The time constant of the discharging circuit of the capacitor substantially corresponds to the time constant of the loaded Q values of the capacitive and inductive elements in the tank circuit.

Figure 1:
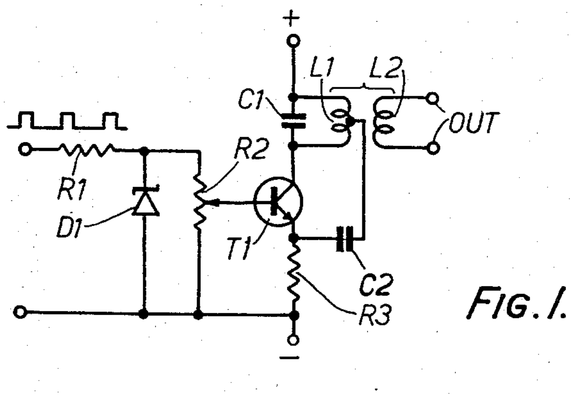

This invention relates to pulse triggered oscillation generators, i.e. to generators which can be triggered to produce a train of oscillations by an applied input or pulse.

A common requirement is for an oscillator which can be triggered by an input pulse to produce a train of substantially constant amplitude oscillations accurately at a desired frequency. Such a train is often required for use to produce regular constant amplitude pulses for shift registers, for use as repetitive synchronising pulses, or for other purposes. When, however, the required train is a relatively short one great difficulty is experienced in satisfying the requirement that the oscillator shall substantially immediately commence to produce oscillations of the required constant amplitude instead of building up exponentially to the required amplitude. An ordinary known oscillator, such, for example, as a Hartley oscillator, proceeds, when pulse triggered, to build up oscillations exponentially to the required final amplitude value. There is thus a short but important initial period during which the amplitude of the oscillations builds up to the required maximum. If such a train of oscillations, including an exponential building up period, is employed to produce a train of pulses, the resultant pulses will vary in spacing during the "build-up" period. This is a serious defect which it is the object of the present invention to avoid and the said invention seeks to provide improved oscillators which when pulsed will produce, practically immediately, full amplitude oscillations without a "build-up" period of appreciable length and which (if so desired) can be arranged to cease oscillation substantially without any appreciable decremental period.

According to this invention a pulse triggered oscillator comprises a frequency-determining tank circuit, a condenser connected to said tank circuit and so arranged as to be charged and to store energy when the oscillator is not oscillating, and a discharge circuit from said condenser into said tank circuit whereby it will discharge energy into the tank circuit when the oscillator is triggered to the oscillating condition, the time constant of said discharge circuit substantially corresponding to the time constant of the loaded Q value of said tank circuit.

Preferably the oscillator is of the Hartley circuit type and includes an active element (which may be a valve or a transistor but is preferably the latter) with a tuned tank circuit in its output electrode circuit, means for applying trigger pulses to the input electrode of said active element, a feedback circuit including the aforesaid condenser connected between the mid-point of said tank circuit and a third electrode of said active element. Preferably an added resistance is connected in series with said condenser in the feedback circuit to limit the discharge current and thereby prevent the first oscillation being of materially greater amplitude than succeeding oscillations. Preferably also a further resistance is included in series in the circuit of said third electrode of the active element to ensure that the condenser charges, when the oscillator is not oscillating, to a voltage sufficiently above the D.C. voltage occurring across said condenser when oscillations are taking place. Preferably again means are provided for limiting the applied trigger pulse ampiltude.

In a preferred modification means are provided for differentiating the triggering pulse applied to the oscillator and a voltage "spike" resulting from differentiation and produced at the end of the pulse is utilised to complete a critical damping circuit which is effectively across the tank circuit. In one arrangement for doing this a "spike" of voltage produced by differentiation from the trailing edge of the pulse is applied to the base of a transistor connected across the tank circuit and arranged to be driven into conduction by said "spike" said transistor, when conductive, applying critical damping to the tank circuit.

The invention is illustrated in the accompanying drawings which show three embodiments thereof diagrammatically. Like reference denote like parts in the drawings.

Referring to FIGURE 1, positive going trigger pulses are applied as indicated through a resistance R1 and an adjustable potentiometer R2 to the base of a transistor T1 constituting the active element of a Hartley type oscillator. A Zener diode D1 is preferably connected as shown across the resistance of the potentiometer. The collector circuit of the transistor T1 includes, in series with the collector circuit, a tuned tank circuit C1, L1 the inductance of which has a tapping connected to the emitter or emitter terminal of T1 through a condenser C2. The emitter circuit includes a resistance R3. Output is taken off at terminals OUT from a coil L2 coupled to the coil L1.

The magnitude of C2 is so chosen in relation to the amplitude of the drive on the base of T1, the value of R3, the characteristics of T1 and the loaded Q value of C1, L1, that build up of the oscillations produced by the application of a positive going pulse to said base is no longer exponential but is substantially instantaneous. This result is achieved because T1 is cut off and C2 is charged to the full value of the H.T. supply before the trigger pulse is applied. As soon as the pulse is applied and T1 conducts, stored energy from C2 is injected or discharged into the tank circuit and from the first half cycle of oscillation the voltage across C2 is reduced and power for maintaining oscillation is taken from the power supply source (not shown) through R3. This is equivalent to reducing the H.T. supply with a time constant equal to that of the tuned circuit and accordingly, whatever the amplitude of the first cycle of oscillation, subsequent oscillations will not be of larger amplitude. C2 thus provides both a discharge circuit for minimizing transient "build-up" and a feed-back connection between the tuned tank circuit and the emitter terminal of T1.

The potentiometer R2 forms a convenient means of adjusting the base drive to the base terminal or electrode of T1 and therefore the rate of transfer of energy from C2 into the tank circuit C1, L1.

For stable operation the trigger pulse amplitude should be kept constant once R2 has been adjusted and in FIG- URE 1 the Zener diode D1 ensures this by limiting the input pulse amplitude.

Figure 2:
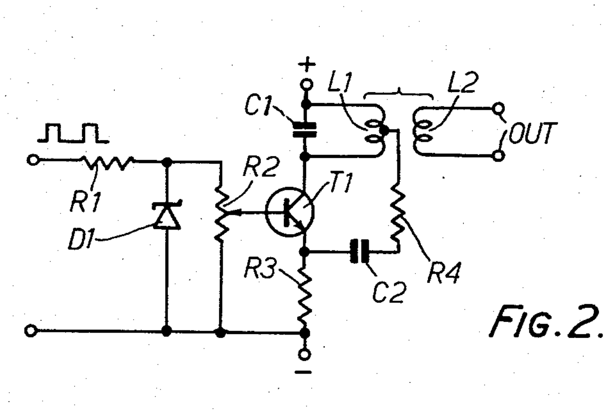

In the modification shown in FIGURE 2 a resistance R4 is included in series with C2 in the feedback circuit to limit the current which can be drawn from C2 and thereby provide transient response correction to prevent the first cycle of oscillation being of greater amplitude than following cycles.

Figure 3:
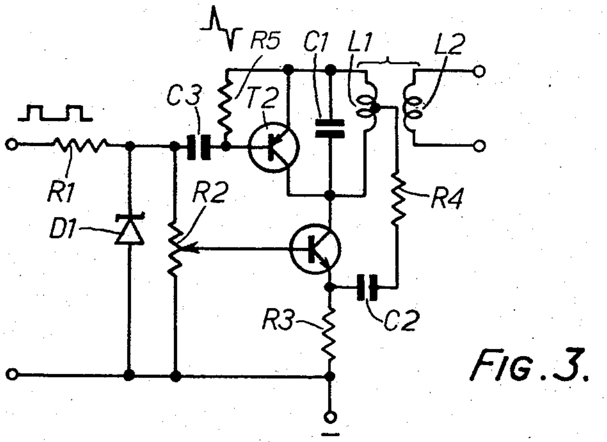

With the embodiments of FIGURES 1 and 2 the decay of oscillation at the end of an applied trigger pulse will be exponential. If this is objected to, the modification of FIGURE 3 may be adopted. Here the trigger pulse is differentiated by the differentiating circuit C3, R5 shown and the negative voltage "spike," occurring at the end of the pulse as a result of differentiation, renders conductive a second transistor T2 which is connected across the tank circuit C1, L1. When thus rendered conductive at the end of the pulse the transistor T2 applies critical damping to the tank circuit and therefore prevents the undesired exponential decay of oscillation.

I claim:

1. A pulse responsive oscillator comprising a tuned tank circuit, pulse responsive means for causing oscillations within said tank circuit, and discharge circuit means interconnecting said pulse responsive means and said tuned tank circuit for discharging energy into said tuned tank circuit upon oscillation thereof, said tuned tank circuit and said discharge circuit means having substantially equal time constants of oscillation build-up and circuit discharge, respectively for minimizing transient build-up in said tuned tank circuit upon initiation of oscillations theren.

2. A pulse responsive oscillator according to claim 1 wherein said pulse responsive means comprises an active element having a plurality of terminals, said tuned tank circuit being connected in series with a first of said terminals, said discharge circuit means comprising a feedback circuit interconnecting a second of said terminals and said tuned tank circuit, said pulse responsive means comprising a pulse responsive conductive path between the terminals thereof connected to said tank circuit and said feedback circuit, whereby pulse activation of said pulse responsive means effects discharging of energy from said discharge circuit into said tank circuit.

3. A pulse responsive oscillator according to claim 2 wherein said pulse responsive means, tank circuit and feedback circuit comprise a Hartley oscillator, said tank circuit comprising a condenser and an inductor in parallel connection, and said feedback circuit being connected to said inductor intermediate the ends thereof.

4. A pulse triggered oscillator comprising a frequency-determining L–C tank circuit, condenser means connected to said tank circuit adapted to be charged and to store energy when the oscillator is not oscillating, and discharge circuit means including said condenser means and connecting said condenser means to said tank circuit for discharging energy into the tank circuit when the oscillator is triggered to the oscillating condition, the capacitive time constant of said discharge circuit which determines the time rate of discharge of said condenser means substantially corresponding to the time constant of the loaded Q value of said tank circuit which determines the time rate of build-up of oscillations in said L–C tank circuit.

5. Apparatus as claimed in claim 4 wherein said oscillator is of the Hartley type having an active element, said tank circuit being in the output electrode circuit of the active element of the oscillator and comprising means for applying trigger pulses to the input electrode of said active element, a feedback circuit including the aforesaid condenser means connected between the mid-point of said tank circuit and a third electrode of said active element said condenser means being responsive to conduction by said active element to discharge therethrough into said tank circuit.

6. An oscillator as claimed in claim 5 wherein an added resistance is connected in series with said condenser in said feedback circuit to limit the discharge current and thereby prevent the first oscillation being of materially greater amplitude than succeeding oscillations.

7. An oscillator as claimed in claim 5 wherein a further resistance means is included in series in the circuit of said third electrode of the active element for causing said condenser means to charge to a higher D.C. voltage when the oscillator is not oscillating with respect to the D.C. voltage occurring across said condenser when oscillations are taking place.

8. An oscillator as claimed in claim 5 and comprising means for limiting the applied trigger pulse amplitude.

9. An oscillator as claimed in claim 5 including a critical damping circuit electrically connected across said tank circuit comprising means for differentiating the triggering pulse applied to the oscillator for producing a voltage spike resulting from said differentiation at the end of said pulse, and means for completing said critical damping circuit in response to said voltage spike.

10. An oscillator as claimed in claim 9 wherein said means for completing said critical damping circuit comprises a transistor, whereby said spike of voltage produced by differentiation from the trailing edge of the pulse is applied to the base of a transistor connected across the tank circuit and arranged to be driven into conduction by said spike said transistor, when conductive, applying critical damping to the tank circuit.

References Cited

UNITED STATES PATENTS 3,240,955 3/1966 Isborn ------------- 331—117

FOREIGN PATENTS 1,258,329 3/1961 France.
628,532 8/1949 Great Britain.

JOHN KOMINSKI, *Primary Examiner.*

ROY LAKE, *Examiner.*